United States Patent [19]
Chapman

[11] Patent Number: 5,392,510
[45] Date of Patent: Feb. 28, 1995

[54] METHOD OF MOUNTING CONNECTORS TO CIRCUIT BOARD

[75] Inventor: James S. Chapman, Lee's Summit, Mo.

[73] Assignee: AT&T Corp., Murray Hill, N.J.

[21] Appl. No.: 164,582

[22] Filed: Dec. 8, 1993

Related U.S. Application Data

[63] Continuation of Ser. No. 965,697, Nov. 2, 1992, abandoned.

[51] Int. Cl.[6] .............................................. H05K 3/30
[52] U.S. Cl. ........................................ 29/837; 29/834
[58] Field of Search ................. 29/464, 468, 739, 740, 29/741, 759, 760, 832, 834, 837, 842; 439/79, 80

[56] References Cited

U.S. PATENT DOCUMENTS

| | | | |
|---|---|---|---|
| 3,559,819 | 2/1971 | Large | 29/760 X |
| 3,793,720 | 2/1974 | Van Rijsewijk et al. | 29/837 |
| 4,328,613 | 5/1982 | Kirkpatrick | 29/837 |
| 4,370,806 | 2/1983 | Funcik et al. | |
| 4,399,988 | 8/1983 | De Shong | 29/760 X |
| 4,744,141 | 5/1988 | Musiani | 29/741 |
| 5,092,774 | 3/1992 | Milan . | |

FOREIGN PATENT DOCUMENTS

| | | | |
|---|---|---|---|
| 73489 | 3/1983 | European Pat. Off. | 29/837 |
| 39600 | 1/1991 | Japan | 29/837 |
| 3159199 | 7/1991 | Japan | 29/740 |

OTHER PUBLICATIONS

*AT&T Metral TM Interconnection System Product Catalog*, (Aug. 1992) pp. 9–10.

Primary Examiner—Peter Dungba Vo
Attorney, Agent, or Firm—Lester H. Birnbaum

[57] ABSTRACT

Disclosed is a method and apparatus for mounting connectors to printed circuit boards. The circuit boards are aligned with the connectors by inserting spring-loaded pins through holes in the board. The connectors are then mounted by inserting pegs on the connector housings through the same holes which include the pins. The pins are displaced from the holes as the pegs are inserted therein while alignment is maintained.

4 Claims, 3 Drawing Sheets

METHOD OF MOUNTING CONNECTORS TO CIRCUIT BOARD

This application is a continuation of application Ser. No. 07/965,697, filed on Nov. 2, 1992, now abandoned.

BACKGROUND OF THE INVENTION

This invention relates to circuit packs and, in particular, to a method and apparatus for fabricating the circuit packs.

Circuit packs include semiconductor components and interconnecting conductive layers formed on a printed circuit board. The boards typically include one or more connectors mounted at the edge of the board to provide electrical connection of the circuit to some outside apparatus such as a backplane. These connectors often include large arrays of terminal leads which are small and delicate, and must be precisely aligned with corresponding through-holes in the board to make electrical contact with the conductive layers and components on the board. Since the boards often come in a large variety of sizes, providing tooling or locating holes for alignment of the board has been a significant problem.

SUMMARY OF THE INVENTION

The invention, in accordance with one aspect, is a method of mounting a connector with a housing to a printed circuit board. The circuit board is placed so that at least one spring-loaded pin aligned with the connector is inserted through a mounting hole in the board. A portion of the connector housing is then inserted into the mounting hole while displacing the pin therefrom.

BRIEF DESCRIPTION OF THE DRAWING

These and other features of the invention are delineated in detail in the description to follow. In the drawing.

DETAILED DESCRIPTION

Figure 1:
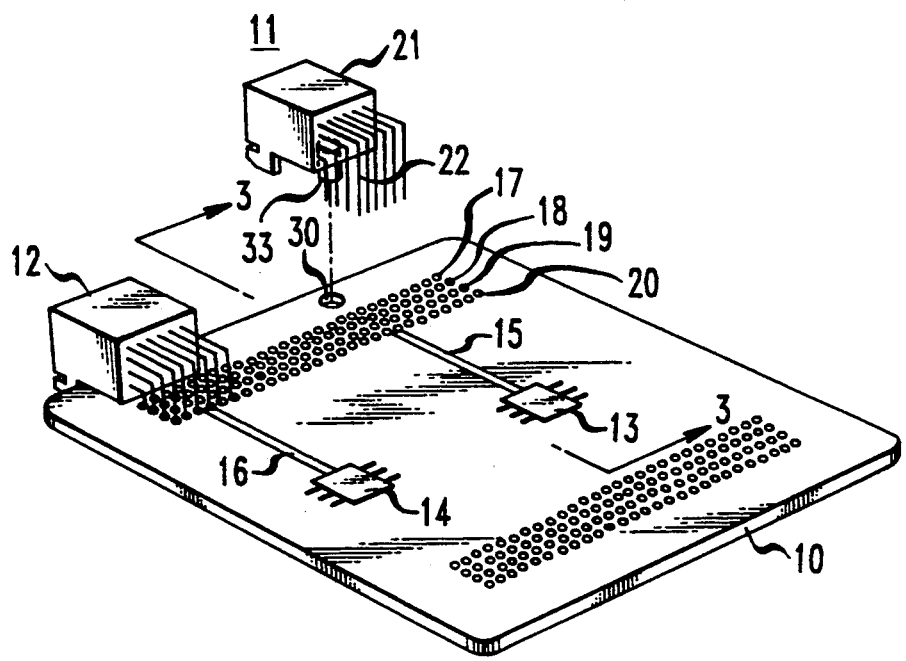
FIG. 1 is a perspective view of a circuit pack and connector which can be fabricated in accordance with the invention.

FIG. 1 illustrates a portion of a printed circuit board 10 to which a pair of electrical connectors, 11 and 12, are mounted near one edge. Component 11 is shown exploded from the board to further illustrate the structure. The board can be any of a number of sizes or shapes, and typically includes electronic components, such as semiconductor elements 13 and 14 mounted thereto. The board is typically 1.5-2.4 mm thick and is usually made of epoxy glass.

The components 13 and 14 are electrically connected by means of conductor elements (e.g., 15 and 16) to an array of through-holes (e.g., 17-20) which are situated near one edge of the board. It will be appreciated that many conductive paths are formed, but only two (15 and 16) are shown for purposes of clarity in the illustration. The conductive paths are usually formed by plating copper on the surface of the board. The through-holes (17-20) are usually formed by chemical or laser etching and then plated with copper. These holes are typically 0.64 mm in diameter with a horizontal and vertical pitch of approximately 2 mm.

The connectors 11 and 12 could be any of a variety of electrical connectors. In this example, each connector includes a housing 21 which encloses a plurality of tynes (not shown) for electrically engaging a plurality of pins which are formed on some outside apparatus such as a backplane (not shown). Each tyne includes a conductive lead (e.g., 22) extending out from the back of the housing. Electrical connection is provided between each tyne and an associated component by inserting its terminal lead (e.g., 22) into a corresponding plated through-hole (e.g., 20). (For a more detailed discussion of a connector, see, e.g., AT&T Metral TM Interconnection System Product Catalog (August 1992), pp. 9-10.)

The board also includes a second array of holes (e.g., 30) formed between the first array and the edge of the board. These holes are not electrically coupled to anything on the board, but, rather, are used to mount the connectors to the board. That is, each hole (e.g., 30) receives a peg (e.g., 33) extending from the bottom of the main body portion of the connector housing in a press-fit engagement so that the connector is secured to the board. In this example, one hole is used for mounting each connector, but any number of holes can be used for this purpose. The second array of holes (e.g., 30) is formed so that when the pegs of the connectors (e.g., 11 and 12) are mounted therein, each of the connector leads (e.g., 22) will be inserted into a corresponding hole (e.g., 20) of the first array of holes.

Figure 2:
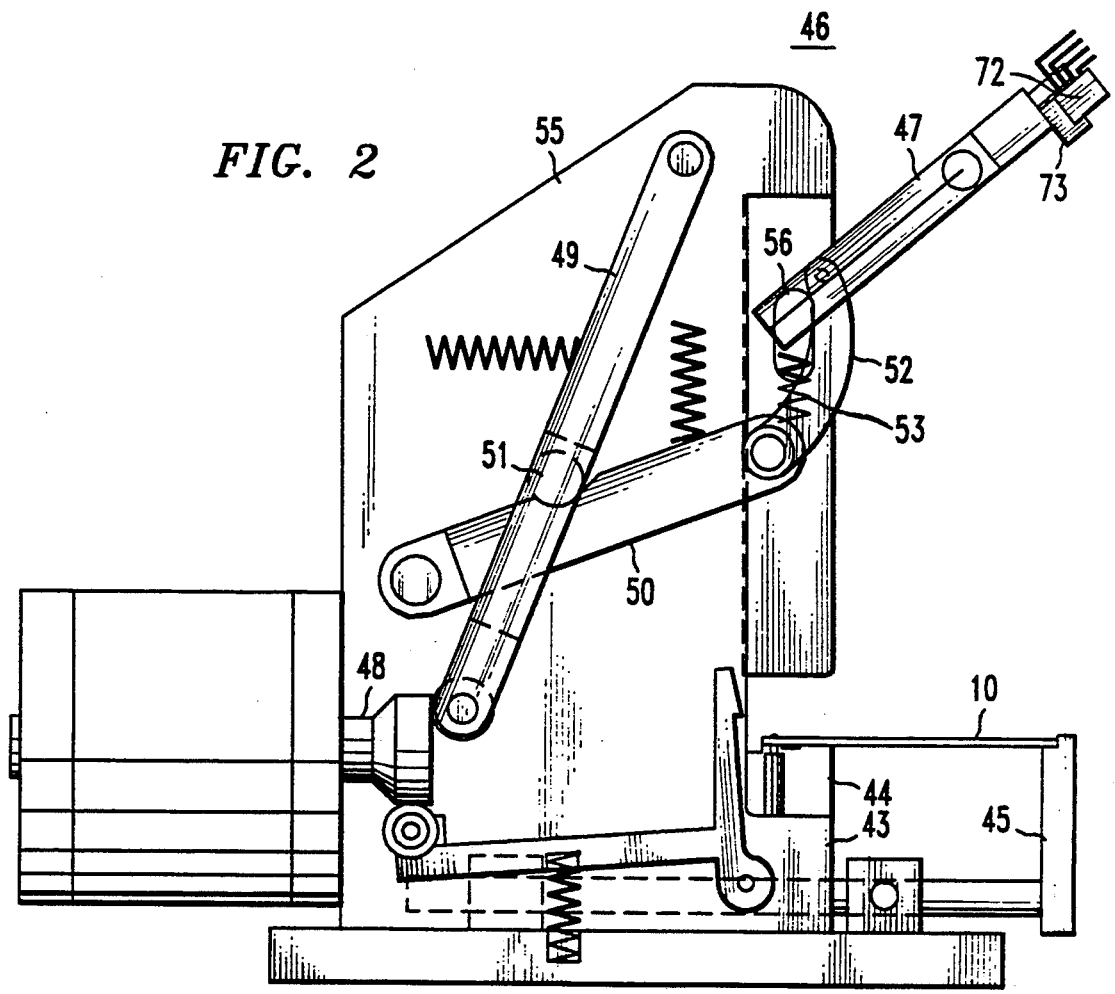
FIG. 2 is a side view of an apparatus in accordance with an embodiment of the invention.

FIG. 2 is an apparatus in accordance with one embodiment of the invention. A plurality of alignment pins (e.g., 40 of FIGS. 3-5) are mounted in a fixed manner within individual slides, (e.g., 42) which are, in turn, mounted within a block 44. The block is mounted to a press bed 43. A spring (e.g., 41 ) is included between each slide and the press bed so that each pin is movable in a vertical direction.

The board 10 is supported in the bed between the block 44 surrounding the pins and a movable support 45 which can be adjusted to accommodate different size boards.

A mounting fixture is provided for holding the connectors and mounting them to the boards in a manner to be described. Several connectors (e.g., 72) can be inserted simultaneously by placing them into the end of a holding arm 47. The holding arm 47 includes an alignment tool holder (64 of FIG. 6) for receiving a plurality of alignment tools (e.g., 54 and 73). Each alignment tool (e.g., 73) has a connector (e.g., 72) inserted therein in order to keep the leads aligned with respect to the connector housing and the pegs. The alignment tools can be made of steel or plastic.

The holding arm 47 is rotatably mounted to the press frame 55 so that the connectors can be loaded away from the board. The holding arm is mechanically coupled to a pneumatic drive cylinder 48 by means of a linkage member 49. The member 49 is, in turn, mechanically coupled to a lever member 50 by means of a roller member 51 which contacts a groove in the member 50. The member 50 is, in turn, mechanically linked with linkage member 52 coupled to the holding arm 47. Thus, when the cylinder is activated, i.e., moves to the fight in FIG. 2, the arm 47 will first rotate to place the connectors above their associated pins and then the arm will travel in a downward vertical direction, compressing springs (e.g., 53) mounted within slot 56, to mount the connectors to the board in the manner described below.

Figure 3:
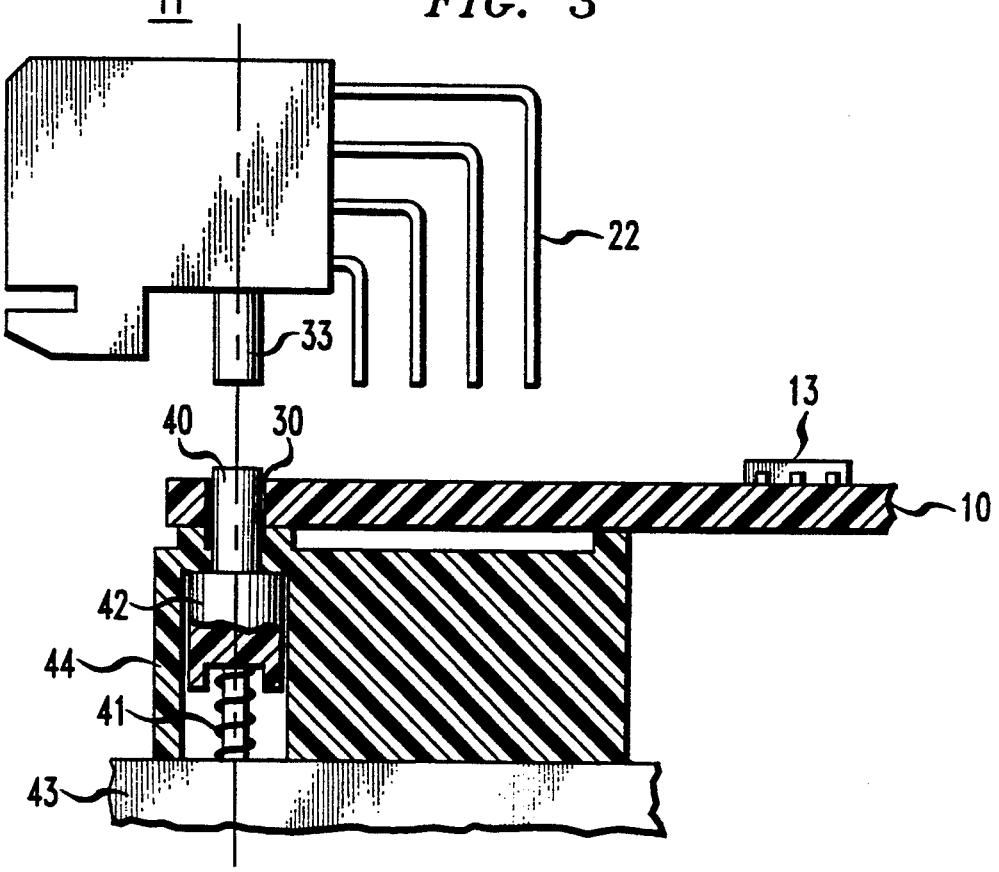
FIGS. 3-5 are cross-sectional views of the circuit pack of FIG. 1 along line 3—3 showing various stages in the mounting of a connector thereon in accordance with an embodiment of the invention.
Figure 6:
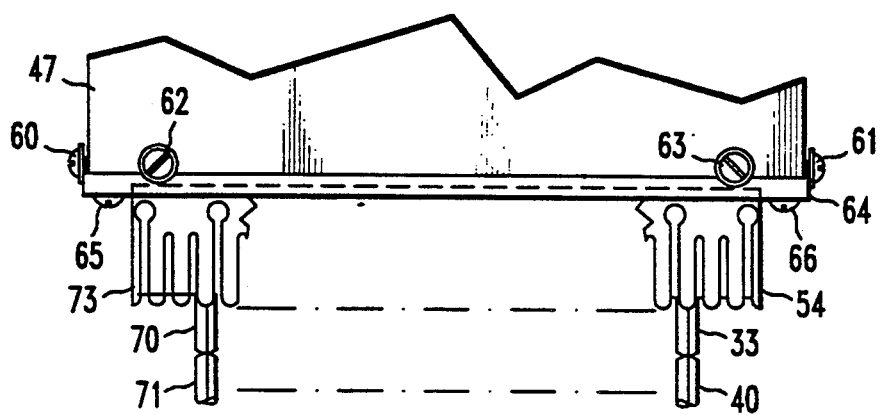
FIG. 6 is a front view of a portion of the apparatus of FIG. 2 showing an alignment mechanism in accordance with an embodiment of the invention.
Figure 4:
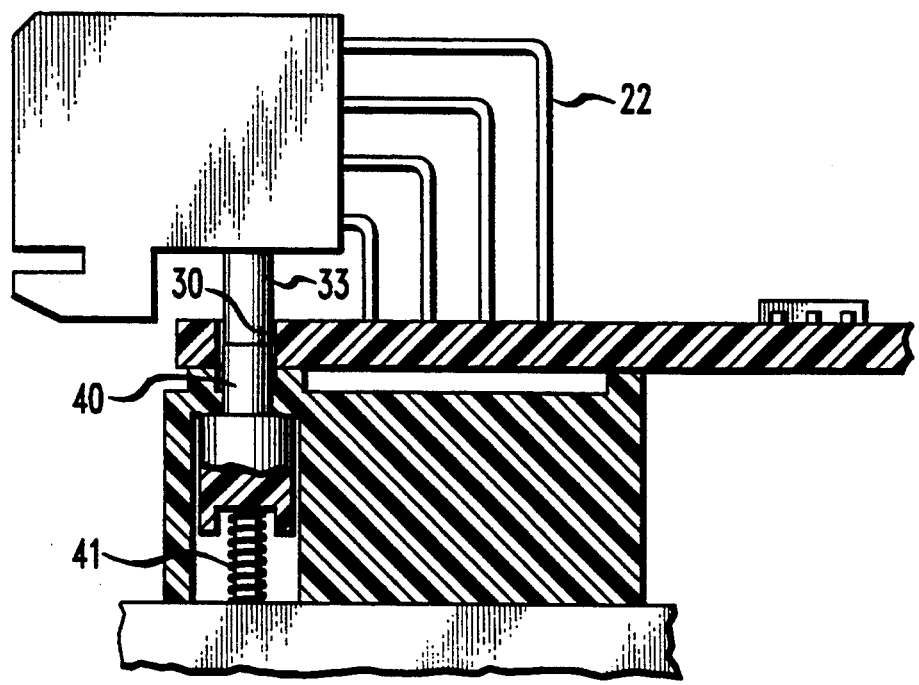

The manner of mounting the connectors to the circuit packs will now be described with further reference to FIGS. 3-5. Prior to introducing the board into the apparatus, each pin, (e.g., 40) is aligned with a peg (e.g., 33) of a particular connector (e.g., 11 ) by adjusting the position of the alignment tool holder (64 of FIG. 6) at the end of the arm 47 as shown in FIG. 6. It will be noted that aligning the pegs (70 and 33 of FIG. 6) at the far ends of the plurality of connectors in the holder to their corresponding pins (71 and 40) will align all other pegs of connectors in the holder to their corresponding pins. Consequently, only the far end pegs and pins are illustrated in FIG. 6.

Alignment is accomplished by first loosening the retaining screws 65 and 66 which mount the alignment tool holder, 64, to the arm, 47, so that the holder is free to move in the X and Y directions (the plane perpendicular to the view of FIG. 6). Screws 60 and 61 adjust the holder in the X-direction and screws 62 and 63 adjust the holder in the Y-direction. When the pegs, 70 and 33, are aligned to the pins, 71 and 40, e.g., by actual physical contact, the retaining screws are tightened and the alignment is set for subsequent connector insertion.

The connectors are then moved away from the pins by rotating the arm 47 of the mounting fixture outward.

The circuit pack 10 is then loaded into the apparatus and positioned so that the spring-loaded pins (e.g., 40) protrude through an associated hole (e.g., 30) in the second array of holes near the board edge. The ann 47 of the mounting fixture is then rotated so that the connectors are positioned above the mounting holes (e.g., 30) and the pegs (e.g., 33) are in axial alignment with their associated spring-loaded pins (e.g., 40). This condition is illustrated in FIG. 3.

The fixture 46 is then actuated to move the connectors vertically downward. As shown in FIG. 4, the pegs (e.g., 33) will enter their associated mounting holes and displace the spring-loaded pins (e.g., 40) from the holes. At the position illustrated in FIG. 4, the leads (e.g., 22) of the connector will also enter their associated holes (e.g., 20) of the first array (17-20). The holes of the circuit pack 10 remain in alignment with the pegs and leads of the connectors at least up until the time when the pegs and leads enter their associated holes as a result of the presence of the spring-loaded pins in the mounting holes. In fact, alignment will be maintained even after initial insertion of the pegs in the mounting holes since the spring-loaded pins will only be partially displaced from the holes as illustrated in FIG. 4. In any event, during the insertion operation, either the spring-loaded pins or the pegs or both will be in contact with the appropriate mounting hole in order to maintain alignment.

Figure 5:
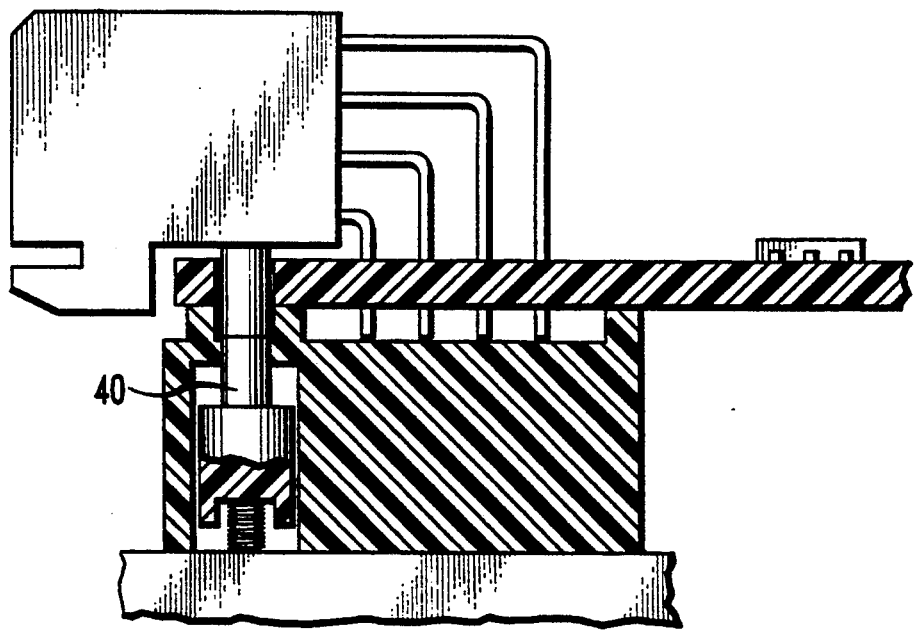

As illustrated in FIG. 5, once the leads and pegs are fully inserted in their final positions, the pins (e.g., 40) will be completely displaced from the mounting holes. At this point, the circuit pack including the mounted connectors can be removed from the apparatus. Upon removal of the pack, the springs (e.g., 41) will cause the pins to be returned to their initial vertical positions so that the mounting process can be repeated with another circuit pack.

I claim:

1. A method of mounting a connector including a housing with a peg extending therefrom and a plurality of terminal leads extending from the housing and spaced from the peg to a printed circuit board including an array of holes for insertion therein of corresponding terminal leads when the connector is mounted to the board comprising the steps of:

aligning only the peg with a spring-loaded pin;

providing the board with at least one mounting hole spaced from the array of holes in accordance with the spacing of the peg from the leads;

placing the board between the spring-loaded pin and the peg of said connector so that the at least one mounting hole of said board is aligned with said spring-loaded pin and inserting said pin through said at least one mounting hole of said board;

inserting the peg into the at least one mounting hole while displacing the pin therefrom and simultaneously positioning the leads of said connector in relation to corresponding holes in the array of holes and inserting the leads of said connector into said array of holes of said board without the use of spring-loaded pins inserted through the array of holes.

2. The method according to claim 1 wherein the spring-loaded pin remains within at least a portion of the mounting hole until the terminal leads are inserted into the array of holes.

3. The method according to claim 1 wherein the circuit board further comprises semiconductor components mounted thereon.

4. The method according to claim 1 wherein during aligning of the peg of the connector housing and insertion of the portion of the connector housing into the mounting hole, the connector is held by an alignment tool which keeps the leads in alignment with the peg of the connector housing.

* * * * *